(12) United States Patent
Liu et al.

(10) Patent No.: US 7,671,669 B2
(45) Date of Patent: Mar. 2, 2010

(54) DEVICE AND METHOD FOR REDUCING INPUT NOISE

(75) Inventors: Wen-Liang Liu, Hsinchu (TW); Chin-Hung Yang, Hsinchu (TW)

(73) Assignee: Holtek Semiconductor Inc., Hsinchu (TW)

( * ) Notice: Subject to any disclaimer, the term of this patent is extended or adjusted under 35 U.S.C. 154(b) by 128 days.

(21) Appl. No.: 12/041,110

(22) Filed: Mar. 3, 2008

(65) Prior Publication Data
US 2009/0121785 A1    May 14, 2009

(30) Foreign Application Priority Data
Nov. 9, 2007    (TW) ............................. 96142334 A

(51) Int. Cl.
*H03K 5/00* (2006.01)

(52) U.S. Cl. .................. 327/551; 327/384; 327/34; 327/553

(58) Field of Classification Search ......... 327/551–559, 327/384, 34, 385; 345/177
See application file for complete search history.

(56) References Cited

U.S. PATENT DOCUMENTS

| | | | | |
|---|---|---|---|---|
| 4,561,002 A | * | 12/1985 | Chiu | ........................ 341/26 |
| 6,727,721 B2 | * | 4/2004 | Altrichter et al. | ........... 324/763 |
| 7,218,498 B2 | * | 5/2007 | Caldwell | ................. 361/179 |

* cited by examiner

*Primary Examiner*—Dinh T. Le
(74) *Attorney, Agent, or Firm*—WPAT, PC; Justin King

(57) ABSTRACT

A device and a method for reducing input noise providing at least a microcontroller. The microcontroller comprises: at least a noise reduction device, at least an analog switch and at least a signal output unit. The noise reduction device connected to the ground or a voltage is turned on to charge or discharge a stray capacitor existing on a turned off analog switch so that the amount of charge stored in the stray capacitor is zero or a specific value. Thereby, the noise in a touch switch is reduced and the cost of layout on the PCB is saved.

22 Claims, 9 Drawing Sheets

DEVICE AND METHOD FOR REDUCING INPUT NOISE

BACKGROUND OF THE INVENTION

1. Field of the Invention

The present invention generally relates to a device and a method for reducing input noise and, more particularly, to a device and a method for reducing input noise using a noise reduction device turned on and connected to a ground or a voltage so that a plurality of charges stored in an equivalent capacitor of a turned off analog switch are released or accumulated to zero or a specific value.

2. Description of the Prior Art

The conventional user interface uses mechanic buttons as its input devices. For example, the input devices for telephones, electronic calculators, induction cookers, electric rice cookers are implemented using buttons. However, such input devices have problems such as button bouncing, poor contacts and usage wear. Therefore, touch switches have become more and more popular due to the rapid advancement in development to overcome the problems related to mechanic buttons. In the process for making a touch switch, pads for GND and VDD are disposed around the touch switch on the printed circuit board (PCB) to reduce noise. These pads occupy area. When the area is limited by the circuitry or structure, considerable noise is generated due to insufficient area for GND or VDD.

FIG. 1 is a conventional touch switch PCB 100. In FIG. 1, the meshed portion 110 is covered by pads for GND or VDD. The small black circles are contacts 120 for touch switches surrounding each of the touch switches. These increase the area occupied by the layout on the PCB 100. However, the aforesaid technology is not suitable for reducing input noise when the buttons are used as a user interface. FIG. 2 is an equivalent circuit showing an equivalent capacitor when the analog switch is turned off. The touch switch 200 is connected to an analog input unit 210 (or an analog input switch). Before the analog input unit 210 is turned on, an equivalent capacitor 220 has already existed. The amount of charges stored in the equivalent capacitor 220 depends on where the equivalent capacitor 220 appears and on the operation time of the analog input unit 210. Because of the input noise, the user has to set the software parameters according to practical use. Moreover, the error tolerance of the back-end timer/counter has to be larger, which leads to the need in a timer/counter of a larger number of bits.

Therefore, there exists a need in providing a device and a method for reducing input noise using a noise reduction device turned on and connected to the ground or a voltage so that a plurality of charges stored in the equivalent capacitor are charged or discharged to zero or a specific value. Thereby, the noise in a touch switch is reduced and the cost of layout on the PCB is saved.

SUMMARY OF THE INVENTION

It is a primary object of the present invention to provide a device and a method for reducing input noise to overcome the problems in that the application is limited to the mechanical design in the conventional touch switches.

In order to achieve the foregoing object, the present invention provides a device for reducing input noise, comprising: at least a signal input terminal; at least a RC circuit; and at least a microcontroller. The microcontroller comprises: at least a noise reduction device, having one end being connected to the signal input terminal; at least an analog switch, having one end being connected to the signal input terminal and one end of the noise reduction device; at least a control unit, being connected to the noise reduction device and the analog switch to control the noise reduction device and the analog switch to be turned on or turned off; at least a signal output unit, having one end being connected to the other end of the analog switch and the other end being connected to one end of the RC circuit; and at least an oscillation circuit having one end being connected to the other end of the RC circuit. The noise reduction device is electrically connected to a potential to charge or discharge a plurality of charges stored in the equivalent capacitor to a specific value when the noise reduction device is turned on.

The present invention further provides a method for reducing input noise, comprising steps of:

(1) providing a microcontroller, comprising: at least a noise reduction device, at least an analog switch and at least a signal output unit, wherein one end of the noise reduction device is connected to a signal input terminal, one end of the analog switch is connected to the signal input terminal and one end of the noise reduction device, and the signal output unit is connected to the other end of the analog switch;

(2) turning on the noise reduction device connected to a potential by the microcontroller;

(3) turning off the noise reduction device by the microcontroller;

(4) turning on the analog switch so that the input signal from the signal input terminal is transmitted to the signal output unit by the microcontroller;

(5) turning off the analog switch by the microcontroller; and (6) returning to Step (2).

The present invention further provides a device for reducing input noise, comprising: at least a signal input terminal; at least a RC circuit; and at least a microcontroller. The microcontroller comprises: at least a signal output unit, having one end being connected to one end of the RC circuit; at least an analog switch, having one end being connected to the signal input terminal and the other end being connected to the other end of the signal output unit; at least a noise reduction device, having one end being connected to the other end of the signal output terminal; at least a control unit, being connected to the noise reduction device and the analog switch to control the noise reduction device and the analog switch to be turned on or turned off; and at least an oscillation circuit, having one end being connected to the other end of the RC circuit. The noise reduction device is electrically connected to a potential to charge or discharge a plurality of charges stored in the equivalent capacitor to a specific value when the noise reduction device is turned on.

The present invention further provides a method for reducing input noise, comprising steps of:

(1) providing a microcontroller, comprising: at least a noise reduction device, at least an analog switch and at least a signal output unit, wherein one end of the noise reduction device is connected to a signal output unit, one end of the analog switch is connected to the signal output unit and one end of the noise reduction device, and the other end of the analog switch is connected to a signal input terminal;

(2) turning on the analog switch by the microcontroller to transmit the input signal from the signal input terminal to the signal output unit and turn on the noise reduction device connected to a potential;

(3) keeping the analog switch turned on by the microcontroller and the noise reduction device turned off;

(4) turning on the analog switch by the microcontroller; and (5) returning to Step (2).

Therefore, the plurality of charges stored in the equivalent capacitor of the turned off analog switch is charged or discharged to be zero or a specific value when the noise reduction device is turned on.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE PREFERRED EMBODIMENT

The present invention providing a device for reducing input noise can be exemplified by the preferred embodiments as described hereinafter.

Figure 1:
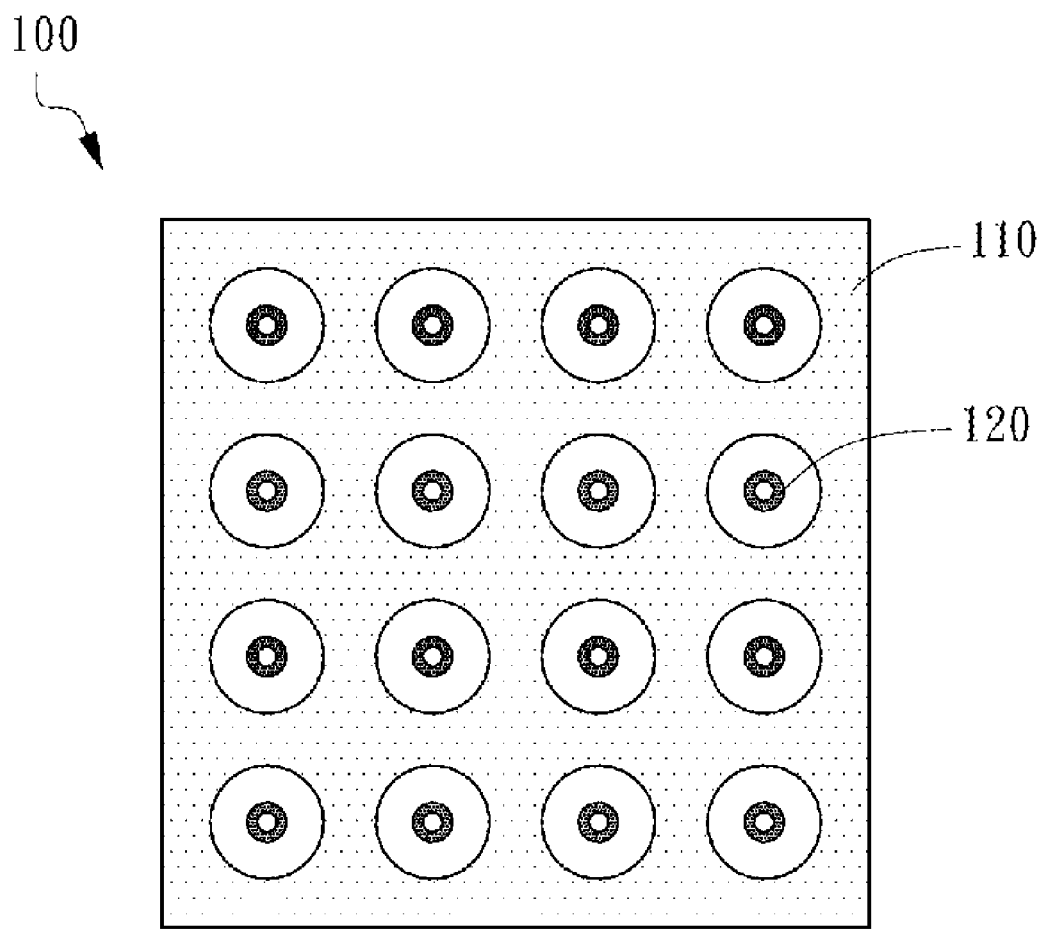
FIG. 1 is a schematic diagram of a PCB for a conventional touch switch.
Figure 2:
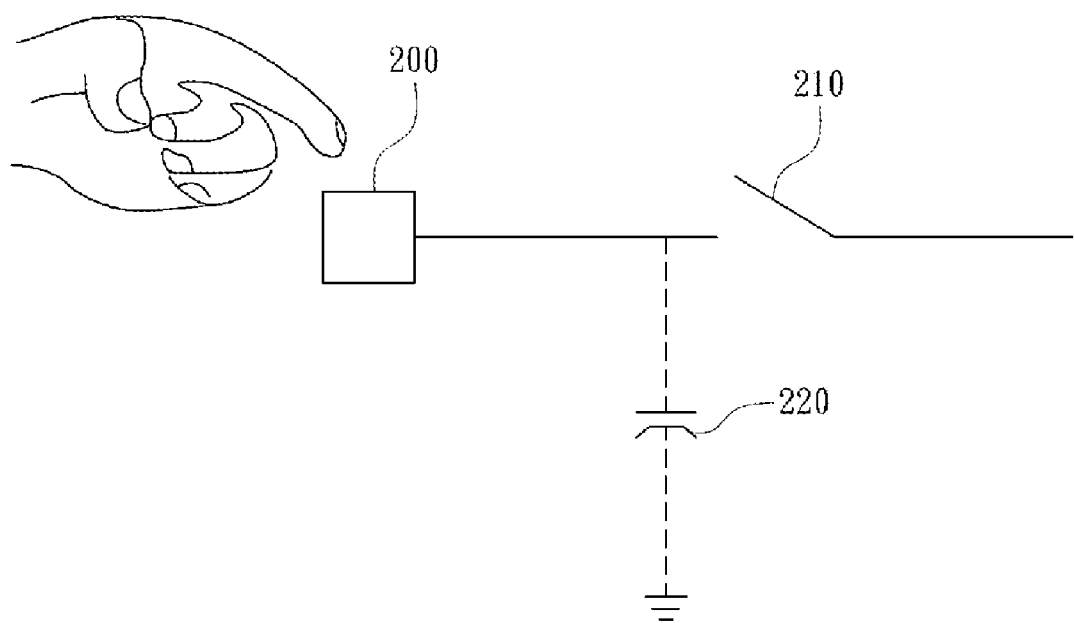
FIG. 2 is an equivalent circuit showing an equivalent capacitor when the analog switch is turned off.
Figure 3:
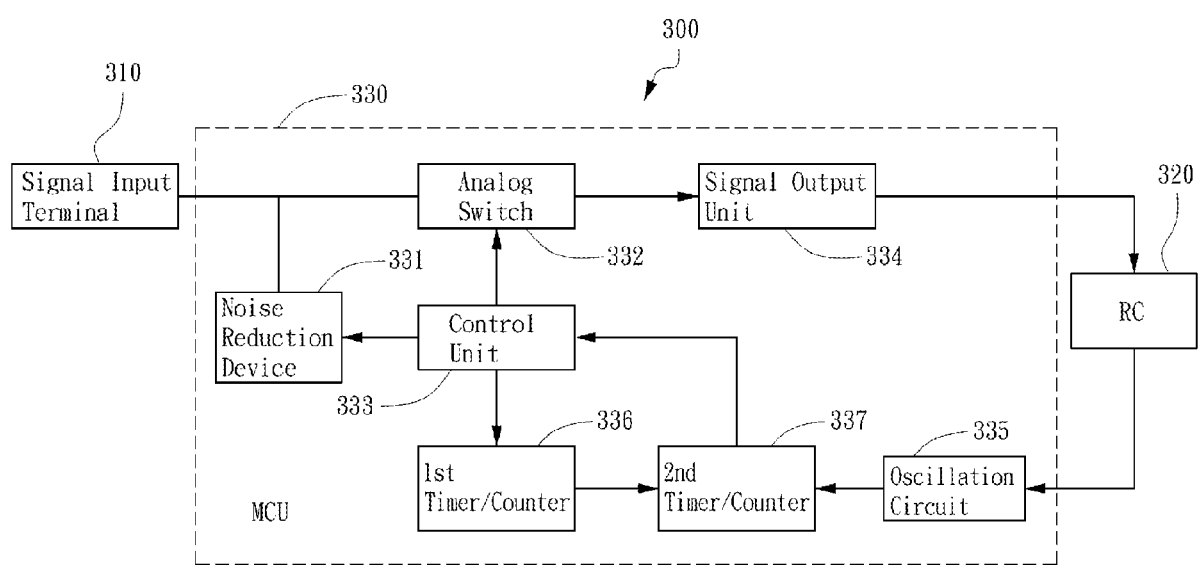
FIG. 3 is a block diagram of a device for reducing input noise according to one preferred embodiment of the present invention.

Please refer to FIG. 3, which is a block diagram of a device for reducing input noise according to one preferred embodiment of the present invention. In FIG. 3, the device for reducing input noise 300 comprises: at least a signal input terminal 310 (exemplified by but not limited to a touch panel or a touch switch); at least a RC circuit 320, which comprises at least a resistor and at least a capacitor; and at least a microcontroller 330. The microcontroller 330 comprises: at least a noise reduction device 331 (exemplified by but not limited to a metal-oxide-semiconductor field-effect transistor (MOSFET)) having one end being connected to the signal input terminal 310; at least an analog switch 332 (exemplified by but not limited to an analog switch), having one end being connected to the signal input terminal 310 and one end of the noise reduction device 331; at least a control unit 333 (exemplified by but not limited to a control unit), being connected to the noise reduction device 331 and the analog switch 332 to control the noise reduction device 331 and the analog switch 332 to be turned on or turned off using software or firmware; at least a signal output unit 334 having one end being connected to the other end of the analog switch 332 and the other end being connected to one end of the RC circuit 320; at least an oscillation circuit 335 (exemplified by but not limited to an oscillation circuit) having one end being connected to the other end of the RC circuit 320; and two timer/counters. These two timer/counters are a first timer/counter 336 having one end being connected to the control unit 333 to generate a base-band and count according to the control unit 333; and a second timer/counter 337 having one end being connected to the first timer/counter 336 and the other end being connected to the other end of the oscillation circuit 335. The second timer/counter 337 is capable of counting at different frequencies according to the oscillation frequency of the oscillation circuit 335 receiving the output signal from the signal output unit 334. The first timer/counter 336 triggers the second timer/counter 337 to interrupt the second timer/counter 337 after a counting time. The control unit 333 accesses and analyzes the contents in the interrupted second timer/counter 337.

Figure 4:
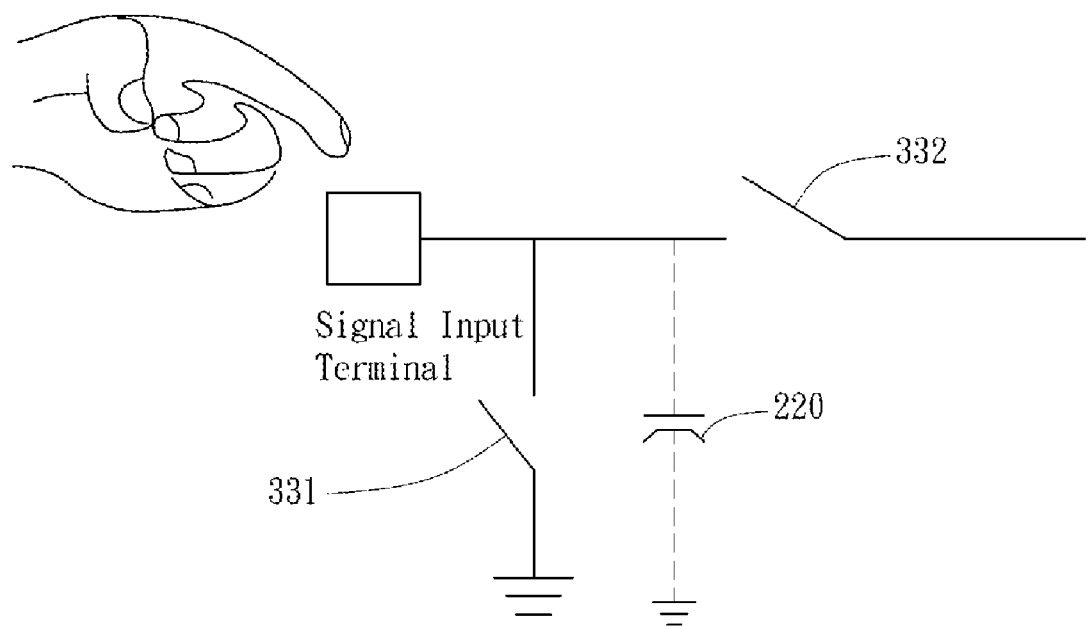
FIG. 4 is an equivalent circuit showing a device for reducing input noise when the noise reduction device is connected to the ground.
Figure 5:
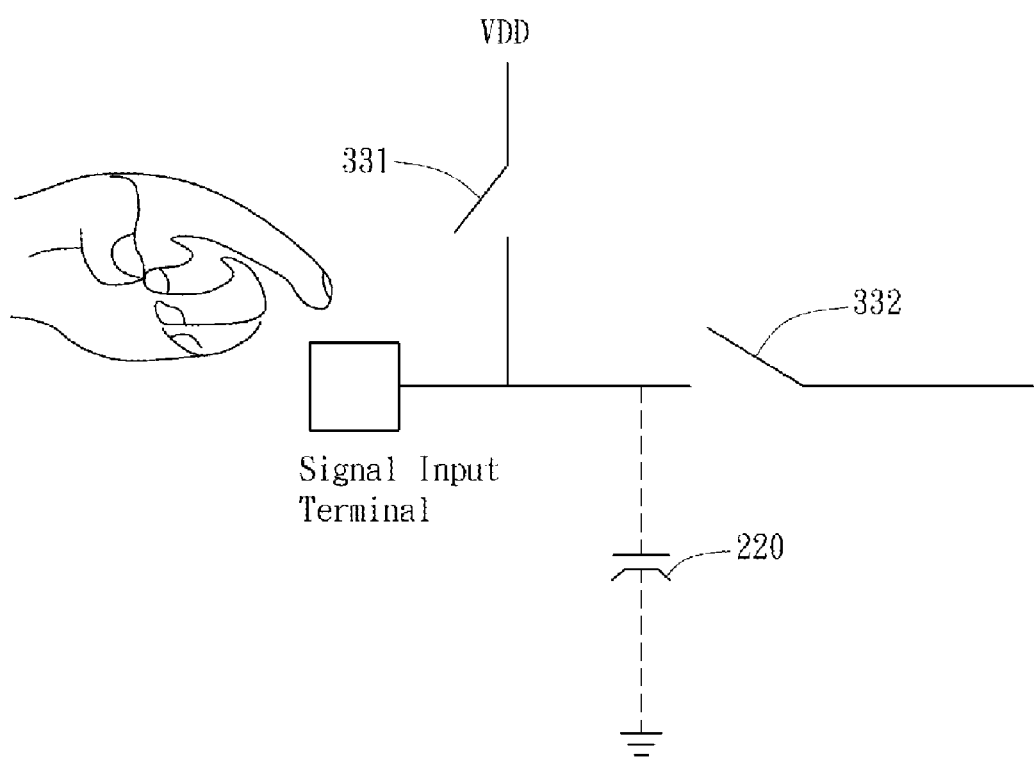
FIG. 5 is an equivalent circuit showing a device for reducing input noise when the noise reduction device is connected to a voltage.

FIG. 4 and FIG. 5 are equivalent circuits showing a device for reducing input noise when the noise reduction device is connected to the ground or a voltage. As the noise reduction device 331 is connected to the ground (in FIG. 4), a plurality of charges stored in the equivalent capacitor 220 of the turned off analog switch 332 is released to zero when the noise reduction device 331 is turned on. As the noise reduction device 331 is connected to a voltage (for example, VDD in FIG. 5), the charges stored in the equivalent capacitor 220 of the turned off analog switch 332 is accumulated so that the potential difference between two electrodes of the equivalent capacitor 220 is specific such as VDD when the noise reduction device 331 is turned on. In the present invention, the noise in a touch switch is reduced and the cost of layout on the PCB is saved.

Figure 6:
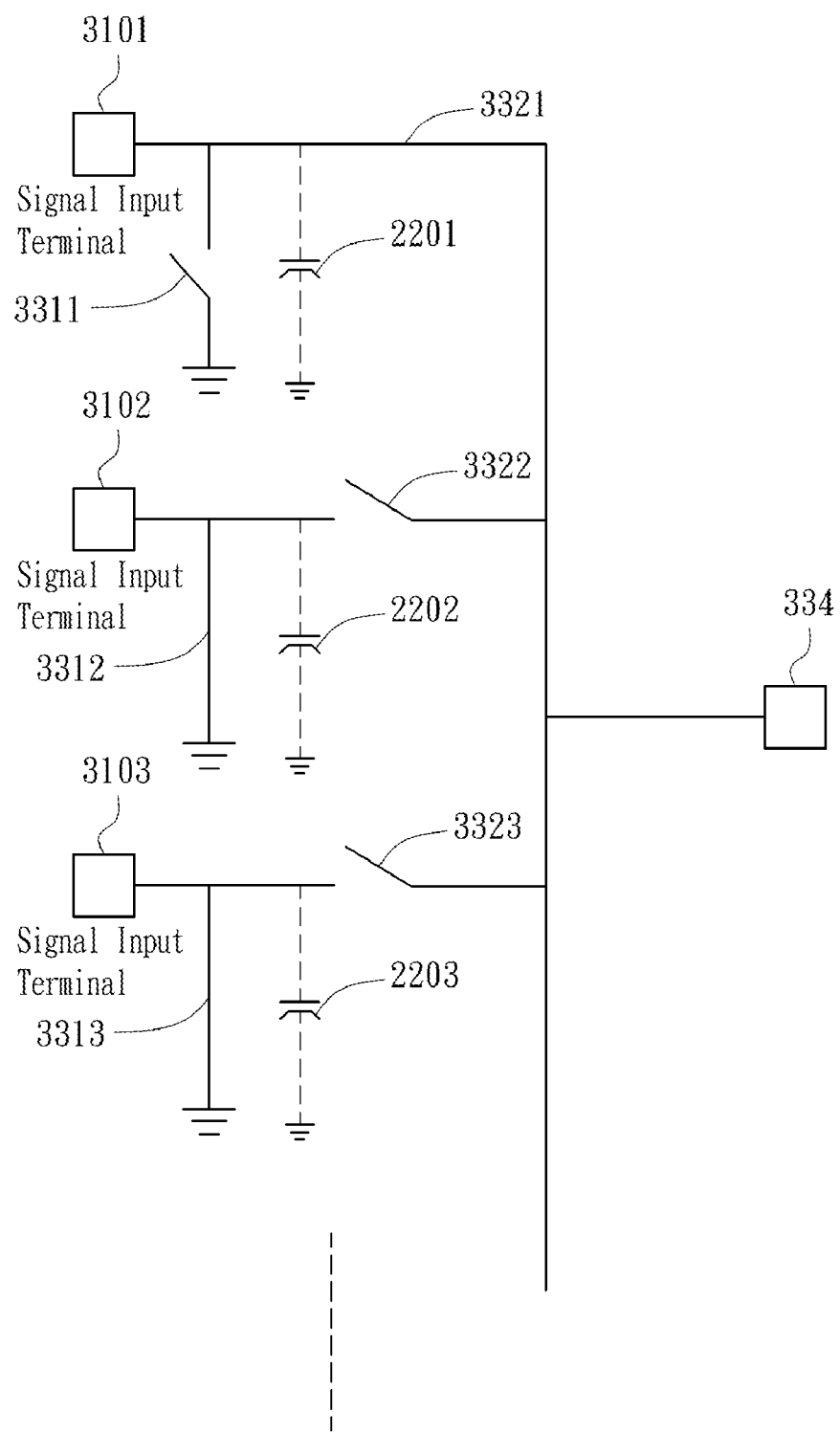
FIG. 6 is an equivalent circuit showing a device for reducing input noise according to another preferred embodiment of the present invention.

FIG. 6 is an equivalent circuit showing a device for reducing input noise according to another preferred embodiment of the present invention. In FIG. 6, there are a plurality of noise reduction devices and a plurality of analog switches. Since an equivalent capacitor 2201 was connected to the ground when a noise reduction device 3311 was turned on so that the plurality of charges stored in the equivalent capacitor 2201 of a turned off analog switch 3321 is discharged to be zero. Therefore, the signal from a signal input terminal 3101 is a low-noise signal when the first analog switch 3321 is turned on. Meanwhile, the other analog switches 3322, 3323 are turned off and the noise reduction devices 3312, 3313 are grounded so that the plurality of charges stored in the equivalent capacitors 2202, 2203 of the turned off analog switches 3322, 3323 are discharged to zero. Since an equivalent capacitor 2202 was connected to the ground when the noise reduction device 3312 was turned on so that the amount of charge stored in the equivalent capacitor 2202 existing on the turned off analog switch 3322 is zero. Therefore, the signal from the signal input terminal 3102 is a low-noise signal when the second analog switch 3322 is turned on. Meanwhile, the other analog switches 3321, 3323 are turned off and the noise reduction devices 3311, 3313 are grounded so that the plurality of charges stored in the equivalent capacitors 2201, 2203 of the turned off analog switches 3321, 3323 are discharged to zero. Similarly, the aforesaid process is repeated so that each input signal through the analog switch is transmitted to the signal output unit 334 without noise. To concentrate on the noise reduction devices 3311, 3312, 3313 and the analog switches 3321, 3322, 3323, the control unit 333 and other elements are not shown in FIG. 6. Those with ordinary skills in the art can figure out the whole structure and operation thereof.

Figure 7:
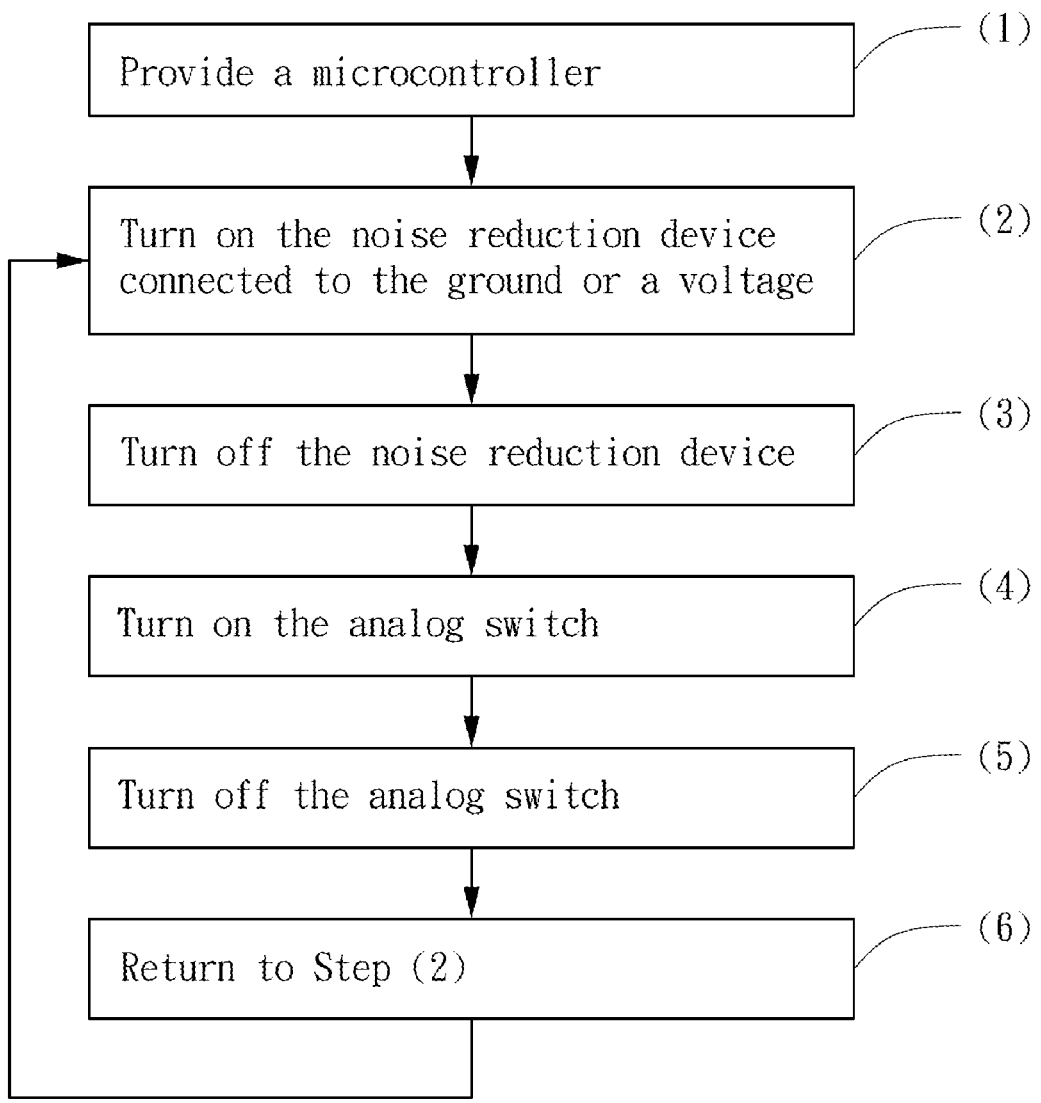
FIG. 7 is a flow-chart of a method for reducing input noise according to one preferred embodiment of the present invention.

FIG. 7 is a flow-chart of a method for reducing input noise according to one preferred embodiment of the present invention. The method comprises steps described as follows:

In Step (1), a microcontroller is provided to comprise: at least a noise reduction device (exemplified by but not limited to a metal-oxide-semiconductor field-effect transistor (MOSFET)), at least an analog switch and at least a signal output unit, wherein one end of the noise reduction device is connected to a signal input terminal (exemplified by but not limited to a touch panel or a touch switch), one end of the analog switch is connected to the signal input terminal and one end of the noise reduction device, and the signal output unit is connected to the other end of the analog switch. The microcontroller further comprises a control unit being connected to the noise reduction device and the analog switch and using software or firmware to control the noise reduction device and the analog switch to be turned on or off.

In Step (2), the noise reduction device connected to the ground or to a potential is turned on by the microcontroller so that the amount of charge stored in the equivalent capacitor existing on the turned off analog switch is zero or a specific value when the noise reduction device is turned on.

In Step (3), the noise reduction device is turned off by the microcontroller.

In Step (4), the analog switch is turned on by the microcontroller so that the input signal from the signal input terminal is transmitted to the signal output unit.

In Step (5), the analog switch is turned off by the microcontroller.

In Step (6), the method returns to Step (2).

It is noted that the flow-chart in FIG. 7 corresponds to the device in FIG. 6. The analog switch and the noise reduction device are complementary. In other words, if an analog switch is turned on to transmit a signal from the signal input terminal 3101 to the signal output unit 334, the corresponding noise reduction device is turned off. On the contrary, if an analog switch is turned off, the corresponding noise reduction device is turned on so that the amount of charge stored in the equivalent capacitor existing on the turned off analog switch is zero or a specific value.

Figure 8:
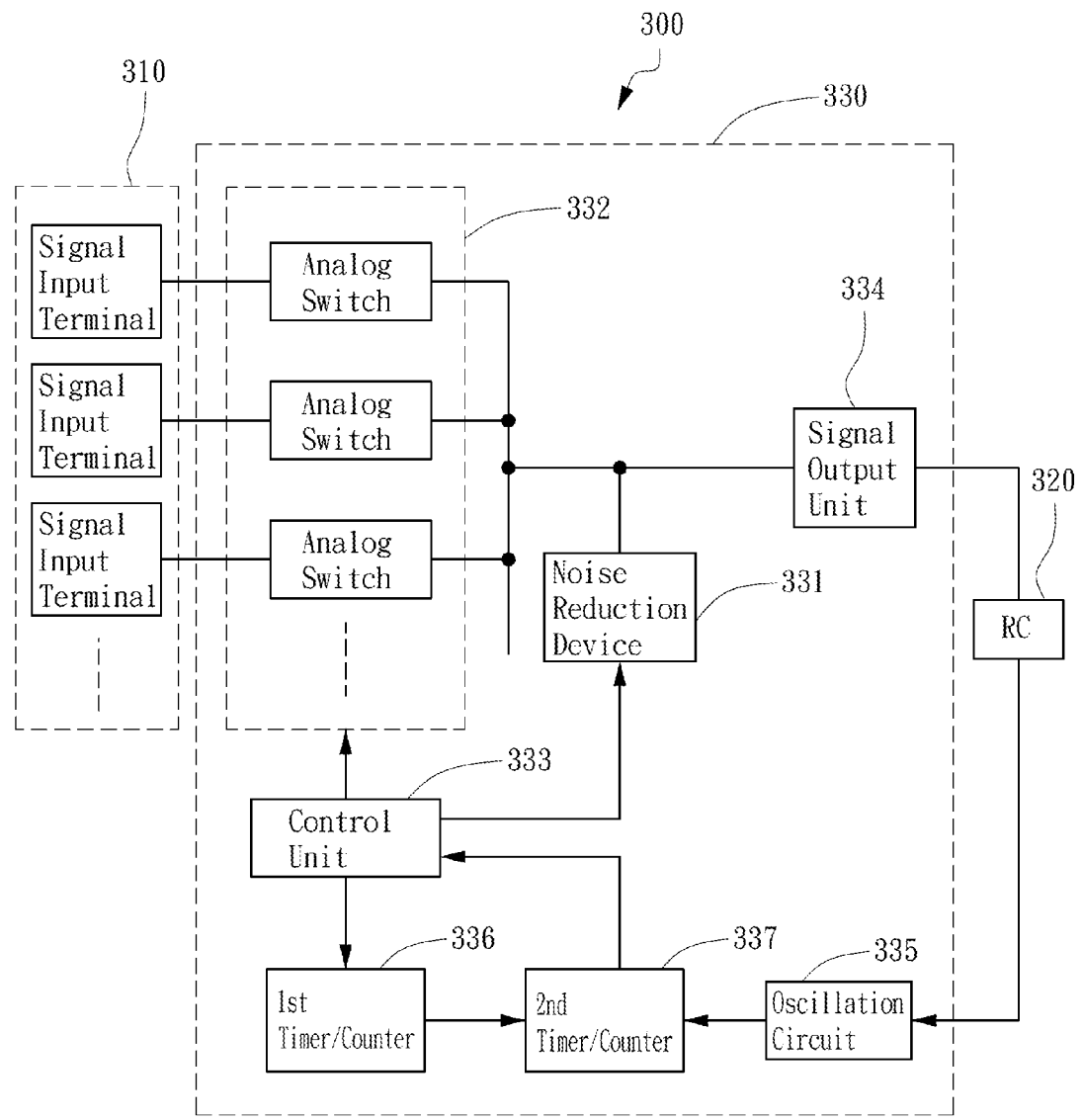
FIG. 8 is a block diagram of a device for reducing input noise according to another preferred embodiment of the present invention.

FIG. 8 is a block diagram of a device for reducing input noise according to another preferred embodiment of the present invention. In FIG. 8, the device for reducing input noise 300 comprises: at least a signal input terminal 310 (exemplified by but not limited to a touch panel or a touch switch); at least a RC circuit 320, which comprises at least a resistor and at least a capacitor; and at least a microcontroller 330. The microcontroller 330 comprises: at least a signal output unit 334, having one end being connected to one end of the RC circuit 320; at least an analog switch 332, having one end being connected to the signal input terminal 310 and the other end being connected to the other end of the signal output unit 334; at least a noise reduction device 331 (exemplified by but not limited to a metal-oxide-semiconductor field-effect transistor (MOSFET)) having one end being connected to the other end of the signal output terminal 334; at least a control unit 333 (exemplified by but not limited to a control unit), being connected to the noise reduction device 331 and the analog switch 332 to control the noise reduction device 331 and the analog switch 332 to be turned on or turned off; and at least an oscillation circuit 335, having one end being connected to the other end of the RC circuit 320; and two timer/counters. These two timer/counters are a first timer/counter 336 having one end being connected to the control unit 333 to generate a base-band and count according to the control unit 333; and a second timer/counter 337 having one end being connected to the first timer/counter 336 and the other end being connected to the other end of the oscillation circuit 335. The second timer/counter 337 is capable of counting at different frequencies according to the oscillation frequency of the oscillation circuit 335 receiving the output signal from the signal output unit 334. The first timer/counter 336 triggers the second timer/counter 337 to interrupt the second timer/counter 337 after a counting time. The control unit 333 accesses and analyzes the contents in the interrupted second timer/counter 337.

Figure 9:
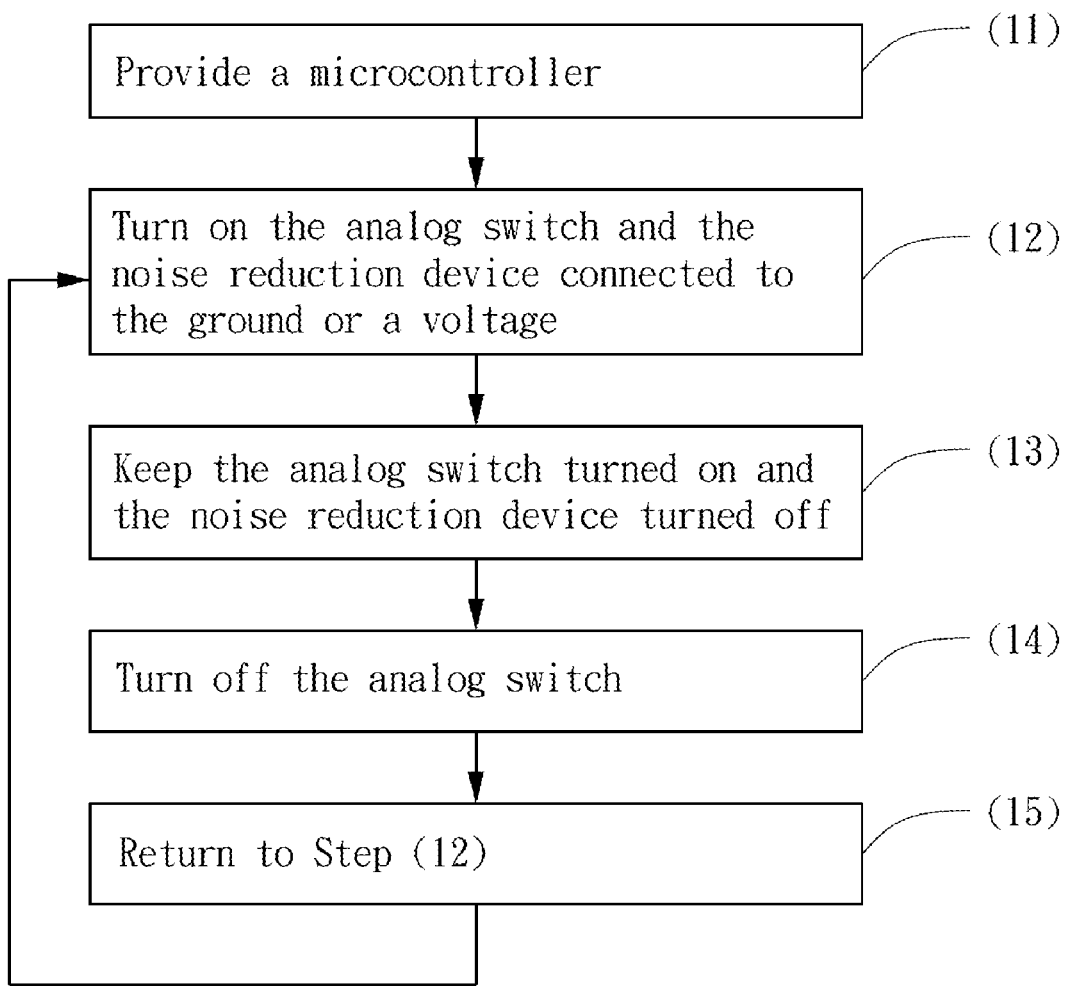
FIG. 9 is a flow-chart of a method for reducing input noise according to another preferred embodiment of the present invention.

FIG. 9 is a flow-chart of a method for reducing input noise according to another preferred embodiment of the present invention. The method comprises steps described as follows:

In Step (11), a microcontroller is provided to comprise: at least a noise reduction device (exemplified by but not limited to a metal-oxide-semiconductor field-effect transistor (MOSFET)), at least an analog switch and at least a signal output unit, wherein one end of the noise reduction device is connected to a signal output unit, one end of the analog switch is connected to the signal output unit and one end of the noise reduction device, and the other end of the analog switch is connected to a signal input terminal (exemplified by but not limited to a touch panel or a touch switch). The microcontroller further comprises a control unit being connected to the noise reduction device and the analog switch and using software or firmware to control the noise reduction device and the analog switch to be turned on or off.

In Step (12), the analog switch is turned on to transmit the input signal from the signal input terminal to the signal output unit and turn on the noise reduction device connected to a potential so that the amount of charge stored in the equivalent capacitor existing on the turned off analog switch is a specific value.

In Step (13), the analog switch is kept turned on and the noise reduction device is turned off.

In Step (14), the analog switch is turned on.

In Step (15), the method returns to Step (12).

It is noted that the flow-chart in FIG. 9 corresponds to the device in FIG. 8. If an analog switch is turned on to transmit a signal from the signal input terminal 310 to the signal output unit 334, the noise reduction device 331 is turned on so that the plurality of charges stored in the equivalent capacitor of the turned off analog switch is released to zero or a specific value when the noise reduction device 331 is turned on.

Accordingly, the present invention discloses a device and a method for reducing input noise using a noise reduction device turned on and connected to the ground or a voltage to charge or discharge the equivalent capacitor of a turned off analog switch so that the amount of charge stored in the equivalent capacitor is at zero or at a specific value. Thereby, the noise in a touch switch is reduced and the cost of layout on the PCB is saved. Therefore, the present invention is novel, useful and non-obvious.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A device for reducing input noise, comprising:
    a signal input terminal;
    a RC circuit with a first RC circuit end and a second RC circuit end; and
    a microcontroller, comprising:
        a noise reduction device, having a first noise reduction device end and a second noise reduction device end, wherein the first noise reduction device end being connected to the signal input terminal;

an analog switch, having a first analog switch end and a second analog switch end, wherein the first analog switch end being connected to both the signal input terminal and the first noise reduction device end of the noise reduction device;

a control unit, being connected to the noise reduction device and the analog switch to control the noise reduction device and the analog switch to be turned on or turned off;

a signal output unit, having a first signal output unit end being connected to the second analog switch end, and a second signal output unit end being connected to the first RC circuit end; and an oscillation circuit, for providing an oscillation frequency to the control unit, and having a first oscillation circuit end being connected to the second RC circuit end.

2. The device for reducing input noise as recited in claim 1, wherein the signal input terminal comprises a touch panel or a touch switch.

3. The device for reducing input noise as recited in claim 1, wherein the noise reduction device is a switch.

4. The device for reducing input noise as recited in claim 1, wherein the noise reduction device is a metal-oxide-semiconductor field-effect transistor (MOSFET).

5. The device for reducing input noise as recited in claim 1, wherein the microcontroller further comprises a timer/counter, coupled between the oscillation circuit and the control unit, for counting at different frequencies according to the oscillation frequency of the oscillation circuit receiving the output signal from the signal output unit.

6. The device for reducing input noise as recited in claim 1, wherein the noise reduction device is connected to ground, the analog switch comprises an equivalent capacitor, and the equivalent capacitor is discharged when the noise reduction device is on.

7. The device for reducing input noise as recited in claim 6, wherein the noise reduction device is connected to a first voltage to charge the equivalent capacitor to the first voltage.

8. A method for reducing input noise, comprising steps of:
(1) providing an input terminal and a microcontroller, the microcontroller comprises a noise reduction device, an analog switch a control unit, an oscillation circuit for providing an oscillation frequency to the control unit, and a signal output unit, wherein a first noise reduction device end of the noise reduction device is connected to both the signal input terminal and a first analog switch end of the analog switch a signal output unit end of the signal output unit is connected to the other a second analog switch end of the analog switch;
(2) connecting the noise reduction device to a potential by the control unit;
(3) turning off the noise reduction device by the control unit;
(4) turning on the analog switch by the control unit, and transmitting an input signal from the signal input terminal to the signal output unit via the analog switch;
(5) turning off the analog switch by the control unit; and
(6) returning to Step (2).

9. The method for reducing input noise as recited in claim 8, wherein the signal input terminal comprises a touch panel or a touch switch.

10. The method for reducing input noise as recited in claim 8, wherein the noise reduction device is a switch.

11. The method for reducing input noise as recited in claim 8, wherein the noise reduction device is a metal-oxide-semiconductor field-effect transistor (MOSFET).

12. A device for reducing input noise, comprising:
a signal input terminal;
a RC circuit with a first RC circuit end and a second RC circuit end; and
a microcontroller, comprising:
a signal output unit, having a first signal output unit end and a second signal output unit end, wherein the second signal output unit end being connected to one end of the first RC circuit end;
an analog switch, having an equivalent capacitor, a first analog switch end and a second analog switch end, wherein the first analog switch end being connected to the signal input terminal and the second analog switch end being connected to the first signal output unit end;
a noise reduction device, having a first noise reduction device end and a second noise reduction device end, wherein the first noise reduction device end is connected to both the signal input terminal and the first analog switch end;
at least a control unit, being connected to the noise reduction device and the analog switch to control the noise reduction device and the analog switch to be turned on or turned off; and
an oscillation circuit, for providing an oscillation frequency to the control unit, having a first oscillation circuit end being connected to the second RC circuit unit;
wherein the equivalent capacitor is being charged when the noise reduction device is electrically connected to a potential.

13. The device for reducing input noise as recited in claim 12, wherein the signal input terminal comprises a touch panel or a touch switch.

14. The device for reducing input noise as recited in claim 12, wherein the noise reduction device is a switch.

15. The device for reducing input noise as recited in claim 12, wherein the noise reduction device is a metal-oxide-semiconductor field-effect transistor (MOSFET).

16. The device for reducing input noise as recited in claim 12, wherein the microcontroller further comprises a timer/counter coupled between the oscillation circuit and the control unit, for counting at different frequencies according to the oscillation frequency of the oscillation circuit receiving the output signal from the signal output unit.

17. The device for reducing input noise as recited in claim 12, wherein the equivalent capacitor is being discharged when the noise reduction device is connected to a ground.

18. The device for reducing input noise as recited in claim 12, wherein the noise reduction device is connected to a first voltage and charges the equivalent capacitor to the first voltage.

19. A method for reducing input noise, comprising steps of:
(1) providing a signal input terminal and a microcontroller, the microcontroller comprises a noise reduction device, an analog switch including an equivalent capacitor, a control unit, an oscillation circuit for providing an oscillation frequency to the control unit, and a signal output unit, wherein a first noise reduction device end of the noise reduction device is connected to the signal input terminal, a first analog switch end of the analog switch is connected to both the signal input terminal and a first noise reduction device end of the noise reduction device, and a second analog switch end of the analog switch is connected to a first signal output unit end of the signal output unit;
(2) turning on the analog switch to transmit by the control unit, transmitting an input signal from the signal input terminal to the signal output unit via the analog switch, and turning on the noise reduction device to a potential by the control unit to charge the equivalent capacitor;
(3) keeping the analog switch activated and the noise reduction device deactivated by the control unit;
(4) turning off the analog switch by the control switch; and
(5) returning to Step (2).

20. The method for reducing input noise as recited in claim 19, wherein the signal input terminal comprises a touch panel or a touch switch.

21. The method for reducing input noise as recited in claim 19, wherein the noise reduction device is a switch.

22. The method for reducing input noise as recited in claim 19, wherein the noise reduction device is a metal-oxide-semiconductor field-effect transistor (MOSFET).

* * * * *